(12) United States Patent
Obata et al.

(10) Patent No.: US 11,463,645 B2
(45) Date of Patent: Oct. 4, 2022

(54) SOLID-STATE IMAGING ELEMENT AND ELECTRONIC DEVICE INCLUDING A SHARED STRUCTURE FOR PIXELS FOR SHARING AN AD CONVERTER

(71) Applicant: SONY SEMICONDUCTOR SOLUTIONS CORPORATION, Kanagawa (JP)

(72) Inventors: Kenichi Obata, Kanagawa (JP); Masahiko Nakamizo, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 54 days.

(21) Appl. No.: 15/733,126

(22) PCT Filed: Nov. 16, 2018

(86) PCT No.: PCT/JP2018/042413
§ 371 (c)(1),
(2) Date: May 21, 2020

(87) PCT Pub. No.: WO2019/107178
PCT Pub. Date: Jun. 6, 2019

(65) Prior Publication Data
US 2020/0404211 A1 Dec. 24, 2020

(30) Foreign Application Priority Data
Nov. 30, 2017 (JP) .............................. JP2017-229901

(51) Int. Cl.
*H04N 5/3745* (2011.01)
*H01L 27/146* (2006.01)
*H04N 5/369* (2011.01)

(52) U.S. Cl.
CPC .... *H04N 5/37455* (2013.01); *H01L 27/14603* (2013.01); *H01L 27/14612* (2013.01); *H01L 27/14643* (2013.01); *H04N 5/379* (2018.08)

(58) Field of Classification Search
CPC .. H04N 5/37455; H04N 5/379; H04N 5/3745; H01L 27/14603; H01L 27/14612; H01L 27/14643; H01L 27/14609
See application file for complete search history.

(56) References Cited

U.S. PATENT DOCUMENTS 7,847,846 B1 * 12/2010 Ignjatovic .............. H04N 5/378
348/301
2001/0020909 A1 9/2001 Sakuragi et al.
(Continued)

FOREIGN PATENT DOCUMENTS

CN 108476025 A 8/2018
JP 2001-223566 A 8/2001
(Continued)

OTHER PUBLICATIONS

International Search Report and Written Opinion of PCT Application No. PCT/JP2018/042413, dated Jan. 29, 2019, 09 pages of ISRWO.

*Primary Examiner* — Albert H Cutler
(74) *Attorney, Agent, or Firm* — Chip Law Group

(57) ABSTRACT

A solid-state imaging element and an electronic device is provided. A pixel at least includes a photoelectric conversion unit that performs photoelectric conversion, an FD unit to which charge generated in the photoelectric conversion unit is transferred, and an amplification transistor that has a gate electrode to which the FD unit is connected. A reference signal is input to a MOS transistor. The reference signal is referred to when AD conversion is performed on a pixel signal according to an amount of light received by the pixel. Then, a shared structure is employed in which a predeter-
(Continued)

mined number of pixels share an AD converter that includes a differential pair including the MOS transistor and the amplification transistor. Each of the pixels is provided with a selection transistor that is used to select a pixel for which AD conversion is performed on the pixel signal.

6 Claims, 15 Drawing Sheets

(56) References Cited

U.S. PATENT DOCUMENTS

| | | | | |
|---|---|---|---|---|
| 2004/0201761 | A1* | 10/2004 | Mentzer | H04N 5/363 348/308 |
| 2011/0080500 | A1* | 4/2011 | Wang | H04N 5/3535 348/222.1 |
| 2013/0126710 | A1* | 5/2013 | Kondo | H04N 5/379 250/208.1 |
| 2015/0340391 | A1* | 11/2015 | Webster | H01L 27/14629 257/432 |
| 2015/0358510 | A1* | 12/2015 | Wan | H04N 5/2254 348/340 |
| 2018/0288346 | A1* | 10/2018 | Yoshida | H04N 5/363 |

FOREIGN PATENT DOCUMENTS

| | | |
|---|---|---|
| JP | 2013-145907 A | 7/2013 |
| JP | 2013-179313 A | 9/2013 |
| JP | 2017-046116 A | 3/2017 |
| KR | 10-2018-0100553 A | 9/2018 |
| WO | 2017/119220 A1 | 7/2017 |

\* cited by examiner

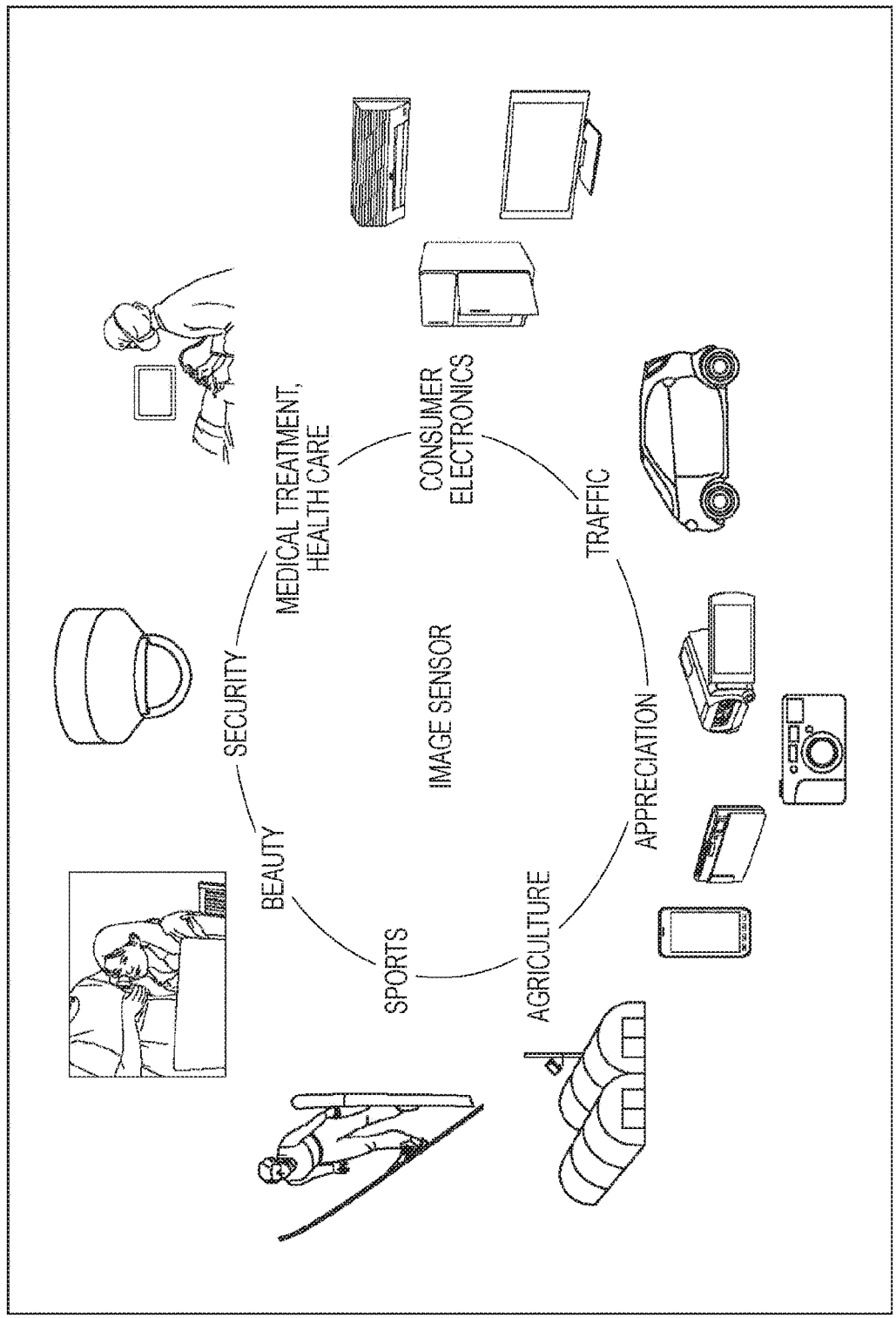

SOLID-STATE IMAGING ELEMENT AND ELECTRONIC DEVICE INCLUDING A SHARED STRUCTURE FOR PIXELS FOR SHARING AN AD CONVERTER

CROSS REFERENCE TO RELATED APPLICATIONS

This application is a U.S. National Phase of International Patent Application No. PCT/JP2018/042413 filed on Nov. 16, 2018, which claims priority benefit of Japanese Patent Application No. JP 2017-229901 filed in the Japan Patent Office on Nov. 30, 2017. Each of the above-referenced applications is hereby incorporated herein by reference in its entirety.

TECHNICAL FIELD

The present disclosure relates to a solid-state imaging element and an electronic device, and in particular, a solid-state imaging element and an electronic device that enable performance to be further improved.

BACKGROUND ART

Conventionally, in electronic devices having an imaging function, such as digital still cameras or digital video cameras, a solid-state imaging element, such as a charge coupled device (CCD) or a complementary metal oxide semiconductor (CMOS) image sensor, is used. For example, in a CMOS image sensor, charge that has been generated in a photodiode due to photoelectric conversion is transferred to a floating diffusion (FD) unit, and analog to digital (AD) conversion is performed on a pixel signal that has been output via an amplification transistor in accordance with an amount of the charge.

Furthermore, in CMOS image sensors, a configuration in which AD conversion is performed on pixel signals in parallel in units of a pixel row and a configuration in which AD conversion is performed on pixel signals in parallel in units of one pixel or a plurality of pixels have been achieved.

For example, Patent Document 1 discloses an imaging element that has a structure in which individual transfer transistors that correspond to, for example, four photodiodes of four pixels are included, these transfer transistors are connected to a common FD unit, and a transistor or the like that follows is shared. Such a structure enables the area of a photodiode per unit pixel area to be increased.

CITATION LIST

Patent Document

Patent Document 1: Japanese Patent Application Laid-Open No. 2013-179313

SUMMARY OF THE INVENTION

Problems to be Solved by the Invention

Meanwhile, in a structure in which a plurality of pixels shares an FD unit, as in the imaging element disclosed in Patent Document 1 described above, the simultaneous transfer of charge from a photodiode to the FD unit in the respective pixels (all-pixel simultaneous read) has failed to be performed. Note that, in an imaging element that has a structure in which a plurality of pixels does not share an FD unit, all-pixel simultaneous reading can be performed, but the size of a circuit increases.

Therefore, in an imaging element that has a structure in which a plurality of pixels shares an FD unit and requires a reduction in the size of a circuit, there is a need for improvements in performance that enable global shutter for performing exposure in all of the pixels at the same timing.

The present disclosure has been made in view of such a situation, and enables performance to be further improved.

Solutions to Problems

A solid-state imaging element in one aspect of the present disclosure includes: a pixel that at least includes a photoelectric conversion unit configured to perform photoelectric conversion, an FD unit to which charge generated in the photoelectric conversion unit is transferred, and an amplification transistor that has a gate electrode to which the FD unit is connected; and a first MOS transistor to which a reference signal is input, the reference signal being referred to when AD conversion is performed on a pixel signal according to an amount of light received by the pixel. A shared structure is employed in which a predetermined number of the pixels share an AD converter that includes a differential pair including the first MOS transistor and the amplification transistor. Each of the pixels is provided with a selection transistor that is used to select the pixel for which AD conversion is performed on the pixel signal.

An electronic device in one aspect of the present disclosure includes a solid-state imaging element. The solid-state imaging element includes: a pixel that at least includes a photoelectric conversion unit configured to perform photoelectric conversion, an FD unit to which charge generated in the photoelectric conversion unit is transferred, and an amplification transistor that has a gate electrode to which the FD unit is connected; and a first MOS transistor to which a reference signal is input, the reference signal being referred to when AD conversion is performed on a pixel signal according to an amount of light received by the pixel. A shared structure is employed in which a predetermined number of the pixels share an AD converter that includes a differential pair including the first MOS transistor and the amplification transistor. Each of the pixels is provided with a selection transistor that is used to select the pixel for which AD conversion is performed on the pixel signal.

In one aspect of the present disclosure, a pixel at least includes: a photoelectric conversion unit configured to perform photoelectric conversion; an FD unit to which charge generated in the photoelectric conversion unit is transferred; and an amplification transistor that has a gate electrode to which the FD unit is connected. A reference signal is input to a first MOS transistor. The reference signal is referred to when AD conversion is performed on a pixel signal according to an amount of light received by the pixel. Then, a shared structure is employed in which a predetermined number of pixels share an AD converter that includes a differential pair including the first MOS transistor and the amplification transistor. Each of the pixels is provided with a selection transistor that is used to select a pixel for which AD conversion is performed on the pixel signal.

Effects of the Invention

In an aspect of the present disclosure, performance can be further improved.

Note that the effects described here are not necessarily restrictive, and any of effects described in the present disclosure may be exhibited.

BRIEF DESCRIPTION OF DRAWINGS

FIG. 15 is a diagram illustrating a usage example in which an image sensor is used.

MODE FOR CARRYING OUT THE INVENTION

Specific embodiments to which the present technology has been applied are described in detail below with reference to the drawings.

<First Configuration Example of Imaging Element>

Figure 1:
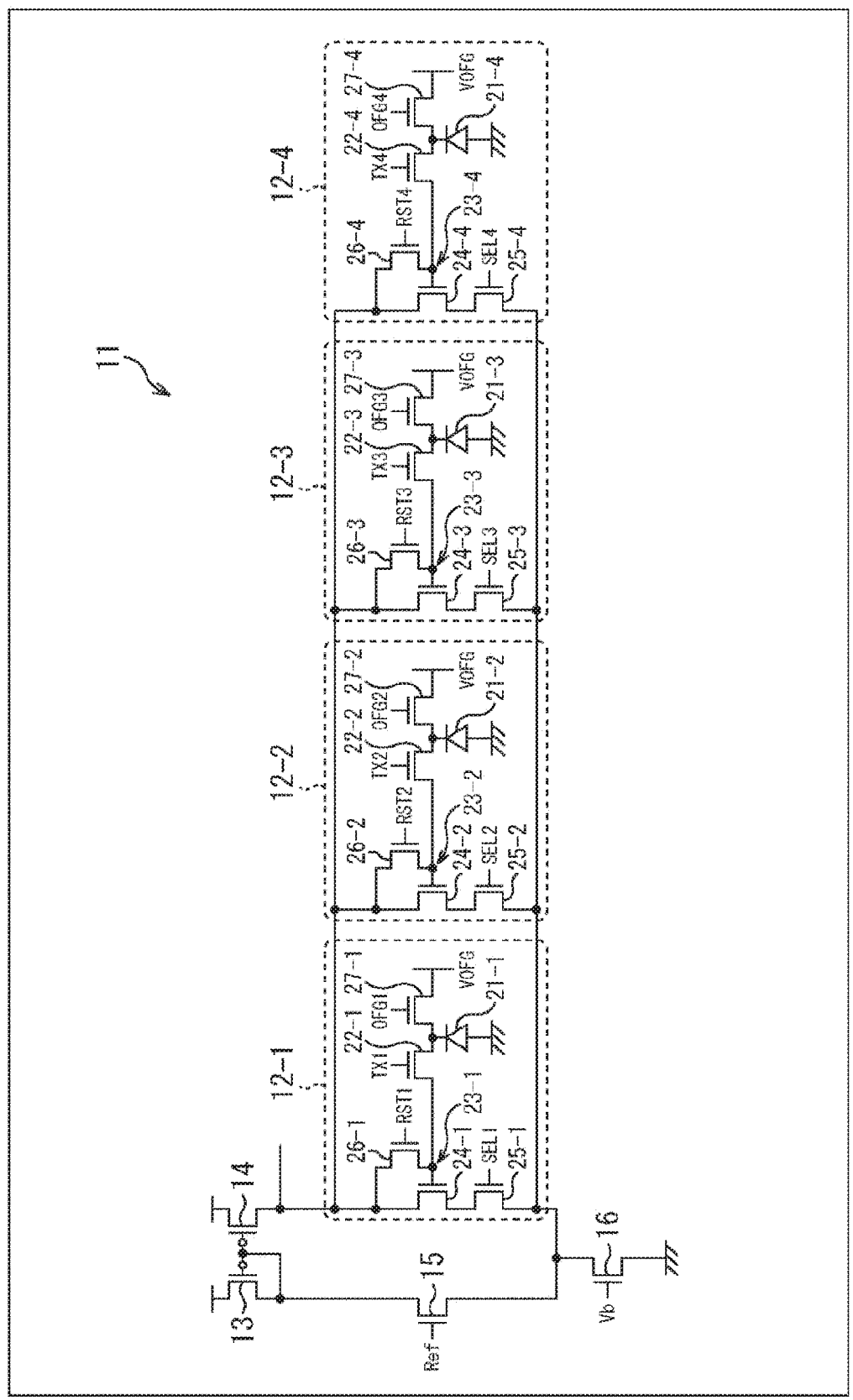
FIG. 1 is a circuit diagram illustrating a configuration example according to a first embodiment of an imaging element to which the present technology has been applied.

FIG. 1 is a circuit diagram illustrating a configuration example according to a first embodiment of an imaging element to which the present technology has been applied.

An imaging element 11 illustrated in FIG. 1 has a structure in which four pixels 12-1 to 12-4 share an AD converter, and is configured to perform AD conversion on pixel signals in parallel in units of the four pixels 12-1 to 12-4. Stated another way, as illustrated, metal oxide semiconductor (MOS) transistors 13 to 16 that configure a front stage of the AD converter are disposed for every four pixels 12-1 to 12-4.

Sources of the MOS transistors 13 and 14 are connected in common to a power supply line. Furthermore, a connecting point of a gate electrode of the MOS transistor 13 and a gate electrode of the MOS transistor 14 is connected to a drain of the MOS transistor 13, and the connecting point is connected to a drain of the MOS transistor 15.

A gate electrode of the MOS transistor 15 is connected to a signal line that supplies a reference signal Ref, and a source of the MOS transistor 15 is connected to a drain of the MOS transistor 16. A gate electrode of the MOS transistor 16 is connected to a signal line that supplies a bias voltage Vb, and a source of the MOS transistor 16 is grounded.

Then, the pixels 12-1 to 12-4 are connected in parallel between a drain of the MOS transistor 14 and the drain of the MOS transistor 16, and a connecting point of the pixels 12-1 to 12-4 and the MOS transistor 14 is connected to an input terminal of a comparator (not illustrated) that configures a rear stage of the AD converter.

Here, the pixels 12-1 to 12-4 are configured similarly. In a case where the pixels 12-1 to 12-4 do not need to be distinguished from each other, hereinafter, the pixels 12-1 to 12-4 are appropriately referred to as a pixel 12. Note that respective units that configure the pixels 12-1 to 12-4 are also referred to in a similar manner.

A pixel 12 includes a photodiode 21, a transfer transistor 22, an FD unit 23, an amplification transistor 24, a selection transistor 25, a reset transistor 26, and an overflow transistor 27.

The photodiode 21 is a photoelectric conversion unit that converts received light into charge, and accumulates charge generated due to photoelectric conversion.

The transfer transistor 22 is driven according to a transfer signal TX, and transfers, to the FD unit 23, the charge generated in the photodiode 21.

The FD unit 23 is a floating diffusion area including predetermined storage capacitance, and temporarily accumulates the charge transferred from the photodiode 21 via the transfer transistor 22.

The amplification transistor 24 forms a differential pair together with the MOS transistor 15, and supplies a signal indicating a difference between the charge accumulated in the FD unit 23 and the reference signal Ref supplied to the gate electrode of the MOS transistor 15 to the comparator that configures the rear stage of the AD converter. Therefore, the AD converter performs AD conversion on a pixel signal that corresponds to the charge accumulated in the FD unit 23.

The selection transistor 25 is driven according to a selection signal SEL, enters into an ON state at a timing of selection as a pixel 12 for which AD conversion is performed on a pixel signal, and establishes connection in such a way that the amplification transistor 24 forms a differential pair together with the MOS transistor 15. Furthermore, the pixel 12 has a configuration in which the selection transistor 25 is connected between the amplification transistor 24 and the MOS transistor 16.

The reset transistor 26 is driven according to a reset signal RST, discharges the charge accumulated in the FD unit 23, and resets the pixel 12.

The overflow transistor 27 is driven according to a discharge signal OFG, and makes the charge accumulated in the photodiode 21 to be discharged to an overflow potential VOFG before the photodiode 21 starts exposure. Furthermore, when an amount of charge that is larger than an amount of charge that can be accumulated in the photodiode 21 has been photoelectrically converted, the charge passes through the overflow transistor 27 and is discharged to the overflow potential VOFG.

The imaging element 11 is configured as described above. A selection transistor 25 of a pixel 12 that has been selected as a pixel for which AD conversion is performed on a pixel signal enters into the ON state, and a MOS transistor 15 and an amplification transistor 24 of the pixel 12 form a differential pair. Therefore, a pixel signal is read from the selected pixel 12, and AD conversion is performed.

Here, the imaging element 11 can achieve the transfer of charge from the photodiode 21 to the FD unit 23 in all of the pixels 12 included in the imaging element 11 at roughly the same timing, what is called global shutter. Then, the imaging element 11 can sequentially perform AD conversion on a pixel signal that corresponds to charge accumulated in the FD unit 23 of each of the pixels 12 in the four pixels 12-1 to 12-4 that share the AD converter.

Figure 2:
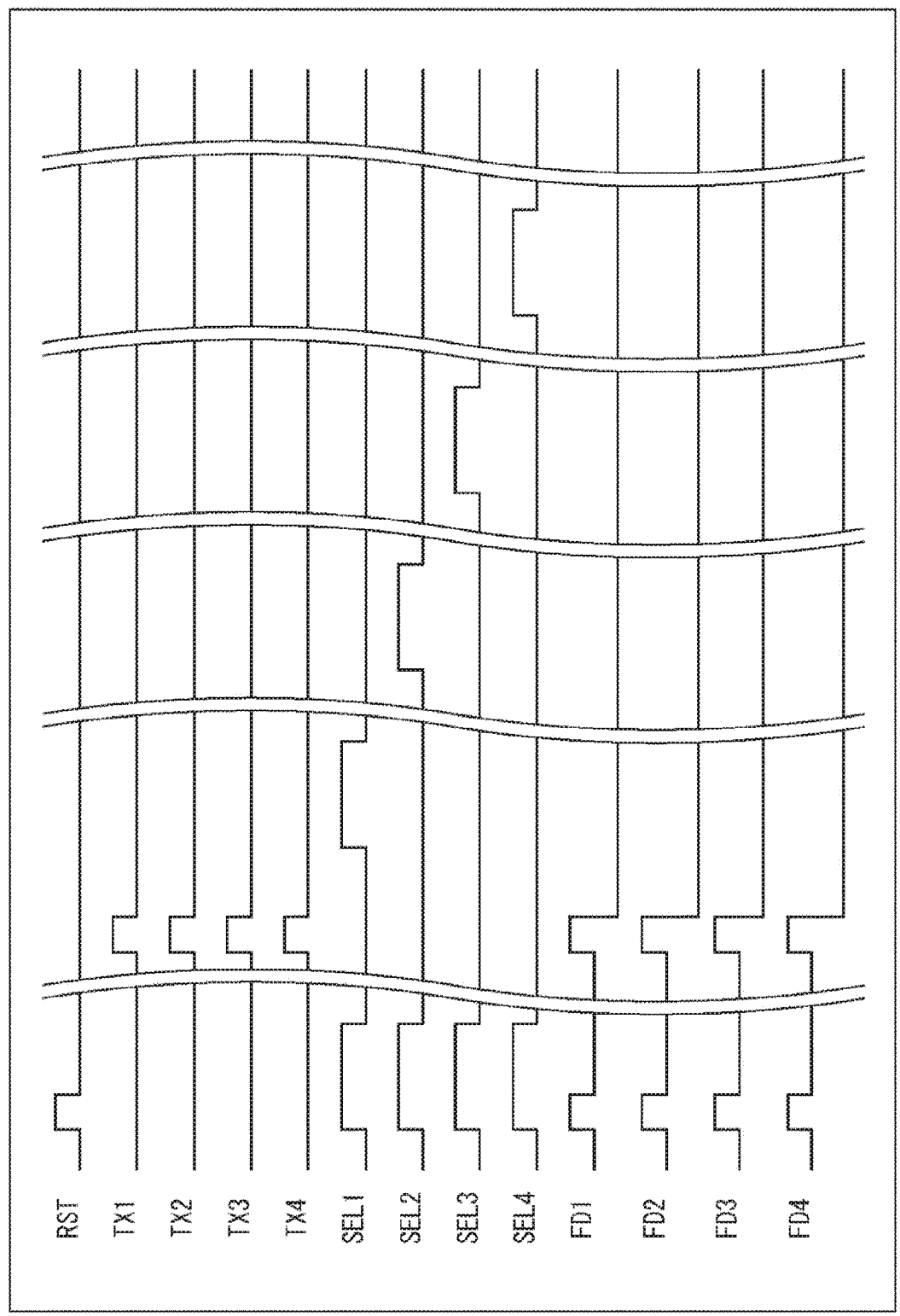
FIG. 2 is a diagram illustrating a pulse timing for explaining driving of the imaging element.

Stated another way, as illustrated in the pulse timing of FIG. 2, in the imaging element 11, first, a reset signal RST and selection signals SEL1 to SEL 4 simultaneously enter into the ON state, and charges accumulated in FD units 23-1 to 23-4 are discharged. Then, after the reset signal RST enters into an OFF state, in a state where the selection signals SEL1 to SEL4 keep the ON state, levels of the FD units 23-1 to 23-4 are held in a not-illustrated rear-stage latch. Next, at a timing at which exposure of photodiodes 21-1 to 21-4 is finished, transfer signals TX1 to TX4 enter into the ON state, charges that have been generated in the photodiodes 21-1 to 21-4 due to photoelectric conversion are transferred to FD units 23-1 to 23-4 at the same timing. These charges are transferred in all of the pixels 12 at the same timing.

Next, the pixels 12-1 to 12-4 are selected in this order as a pixel 12 for which AD conversion is performed on a pixel signal, and AD conversion is performed on the pixel signal by sampling, correlated double sampling (CDS), a difference value between a level of the charge accumulated in each of the FD units 23-1 to 23-4 and a value held in the not-illustrated rear-stage latch. First, the selection signal SEL1 enters into the ON state, and AD conversion is performed on a pixel signal of the pixel 12-1. Next, the selection signal SEL2 enters into the ON state, and AD conversion is performed on a pixel signal of the pixel 12-2. Moreover, the selection signal SEL3 enters into the ON state, and AD conversion is performed on a pixel signal of the pixel 12-3. The selection signal SEL4 enters into the ON state, and AD conversion is performed on a pixel signal of the pixel 12-4.

As described above, in the imaging element 11, the selection transistor 25 is disposed in each of the pixels 12, and a pixel 12 for which AD conversion is performed on a pixel signal is sequentially selected according to the selection signal SEL. Therefore, the imaging element 11 can perform control according to the selection signal SEL to sequentially switch amplification transistors 24-1 to 24-4 that each will form a differential pair together with the MOS transistor 15 that configures the AD converter.

For example, the imaging element disclosed in Patent Document 1, as described above, is configured to select a pixel 12 from which a pixel signal is read in accordance with an operation of the MOS transistor 15. Thus, it is difficult to achieve global shutter.

In contrast, in the imaging element 11, the selection transistor 25 is provided in each of the pixels 12. Thus, even if charge transferred from the photodiode 21 has been accumulated in the FD unit 23, only the amplification transistor 24 of a pixel 12 selected by the selection transistor 25 can form a differential pair together with the MOS transistor 15. Accordingly, the imaging element 11 can achieve global shutter to transfer charge from the photodiode 21 to the FD unit 23 in all of the pixels 12 at roughly the same timing.

Figure 3:
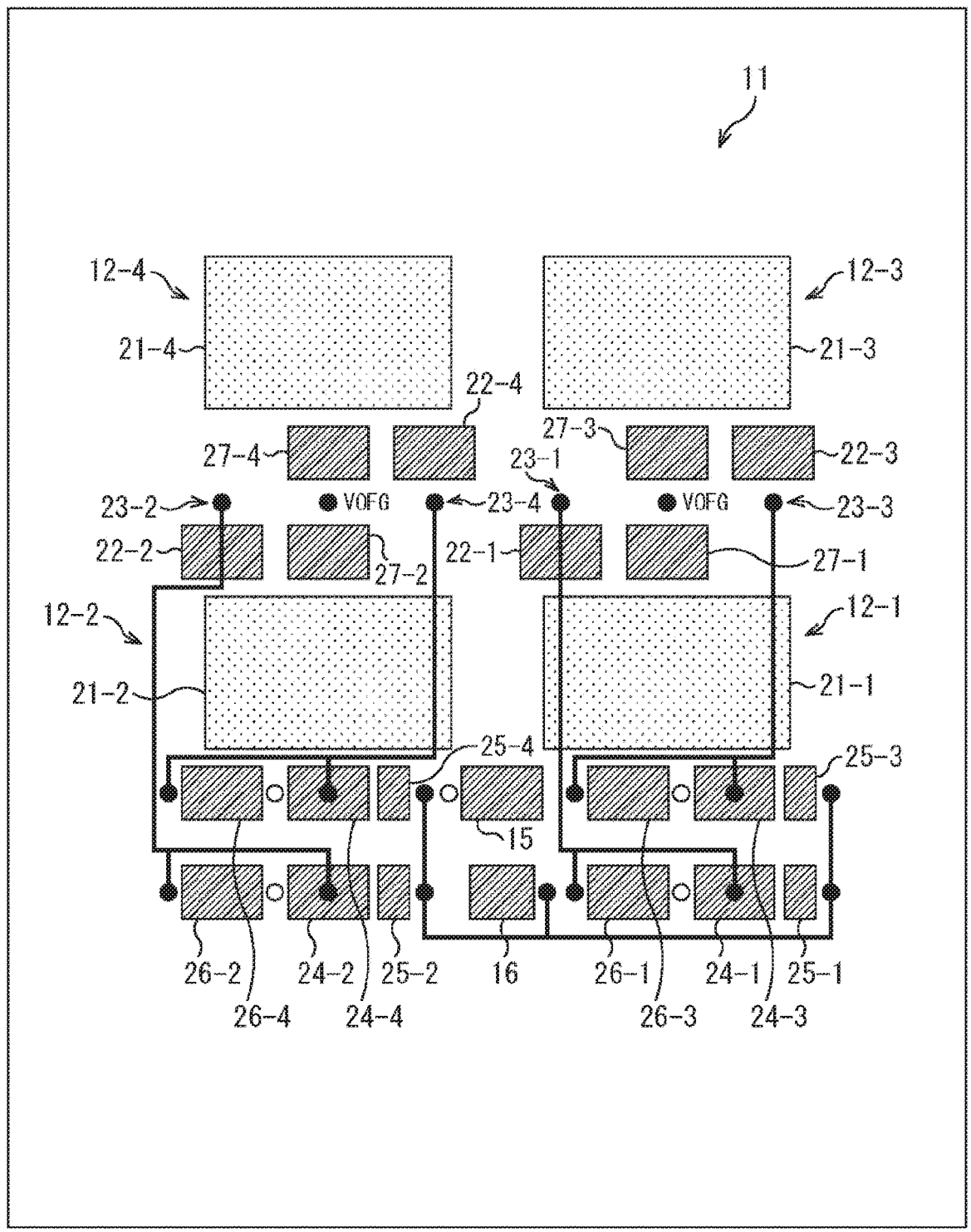
FIG. 3 is a diagram illustrating a planar layout of pixels in the configuration of FIG. 1.

FIG. 3 illustrates a planar layout of the pixels 12-1 to 12-4.

In a pixel 12 in the layout illustrated in FIG. 3, the overflow transistor 27 that is disposed to be adjacent to the photodiode 21 is used to discharge charge in the pixel 12 to the overflow potential VOFG. Accordingly, an electrode that is connected to the overflow potential VOFG is provided on a side opposite to a side close to the photodiode 21 of the overflow transistor 27.

Furthermore, the transfer transistor 22 that is disposed to be adjacent to the photodiode 21 is used to transfer, to the FD unit 23, charge accumulated in the photodiode 21. Accordingly, accordingly, the FD unit 23 that is connected to a gate electrode of the amplification transistor 24 is provided on a side opposite to a side close to the photodiode 21 of the transfer transistor 22.

In the reset transistor 26, one terminal is connected to the FD unit 23, and the other terminal is connected to a drain of the amplification transistor 24. The reset transistor 26 is used to reset a potential of the FD unit 23.

The amplification transistor 24 together with the MOS transistor 15 configures an input stage of a differential amplifier, and is formed to have roughly the same size as a size of the MOS transistor 15.

The MOS transistor 16 is a constant current source that operates by receiving a constant bias voltage Vb in a gate electrode.

As described above, in the imaging element 11, the pixel 12 is configured in such a way that the FD unit 23 is directly connected to the amplification transistor 24 serving as an input of the comparator (not illustrated) that configures the rear stage of the AD converter. Therefore, the imaging element 11 can reduce components of a circuit in comparison with, for example, a pixel that is connected via an amplifier. Accordingly, the imaging element 11 can improve area efficiency, and can achieve a configuration in which one AD converter is combined with a predetermined number of pixels 12. Furthermore, the imaging element 11 can also simultaneously achieve the speeding up of settling of an input potential of the comparator, a reduction in power consumption, improvements in conversion efficiency, and the like.

Furthermore, the imaging element 11 has a layout in which the MOS transistors 15 and 16, the amplification transistors 24-1 to 24-4, the selection transistors 25-1 to 25-4, and the reset transistors 26-1 to 26-4 are disposed below the photodiodes 21-1 to 21-4 that are disposed in the form of 2 by 2. Moreover, the imaging element 11 has a layout in which the transfer transistors 22-1 to 22-4 and the overflow transistors 27-1 to 27-4 are disposed between the photodiodes 21-1 and 21-2 and the photodiodes 21-3 and 21-4 of the photodiodes 21-1 to 21-4 that are disposed in the form of 2 by 2.

By employing such a layout, the photodiode 21 has a rectangular shape, and therefore the imaging element 11 can suppress a difference in an output due to an incident angle of light. In addition, the imaging element 11 can suppress a reduction in the area of the photodiode 21 due to the disposition of respective transistors.

Furthermore, in the imaging element 11, a difference in transistor performance between the MOS transistor 15 and the amplification transistors 24-1 to 24-4 appears as an offset of a differential output. Accordingly, in order to reduce an error in gate shapes of these transistors, the imaging element 11 employs a layout in which the MOS transistor 15 is disposed close to the amplification transistors 24-1 to 24-4. Therefore, the occurrence of the offset of the differential output can be suppressed.

Furthermore, it is desirable that the imaging element 11 has an electric field facing a side to which charge is transferred in order to obtain a satisfactory charge transfer characteristic. Accordingly, the imaging element 11 employs a layout in which the transfer transistor 22 and the overflow transistor 27 are disposed on the same side with respect to the photodiode 21 to be adjacent to each other. Therefore, a satisfactory charge transfer characteristic can be obtained.

By employing such a layout, the imaging element 11 can efficiently achieve a configuration in which one AD converter is combined with a predetermined number of pixels 12 by using a pixel size that is similar to a pixel size of a conventional imaging element.

<Second Configuration Example of Imaging Element>

A second configuration example of an imaging element is described with reference to FIGS. 4 and 5. Note that, in an imaging element 11A illustrated in FIGS. 4 and 5, the same reference signs are used in a configuration that is common to a configuration of the imaging element 11 described above with reference to FIGS. 1 and 3, and the detailed description thereof is omitted.

Figure 4:
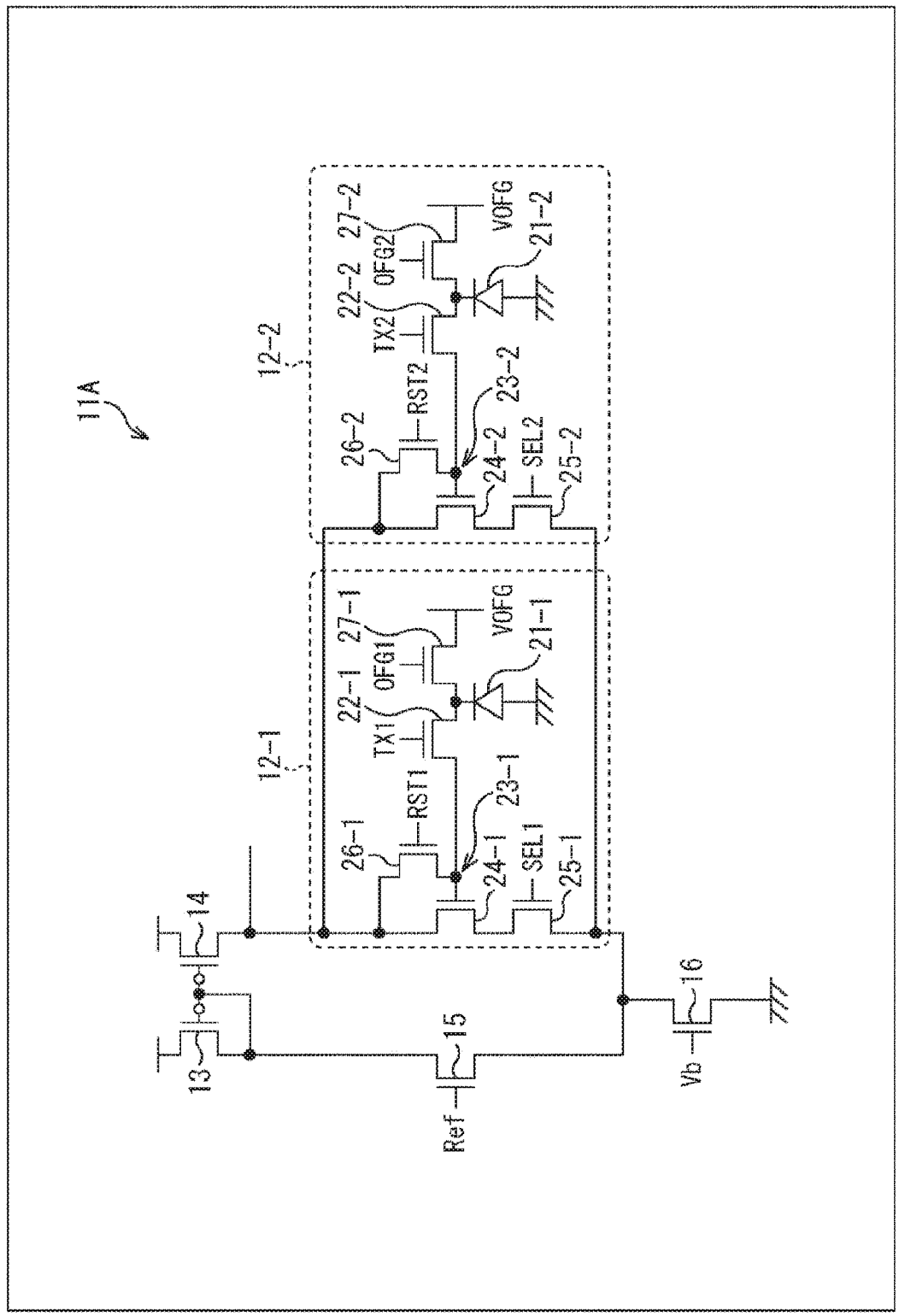
FIG. 4 is a circuit diagram illustrating a configuration example according to a second embodiment of the imaging element.
Figure 5:
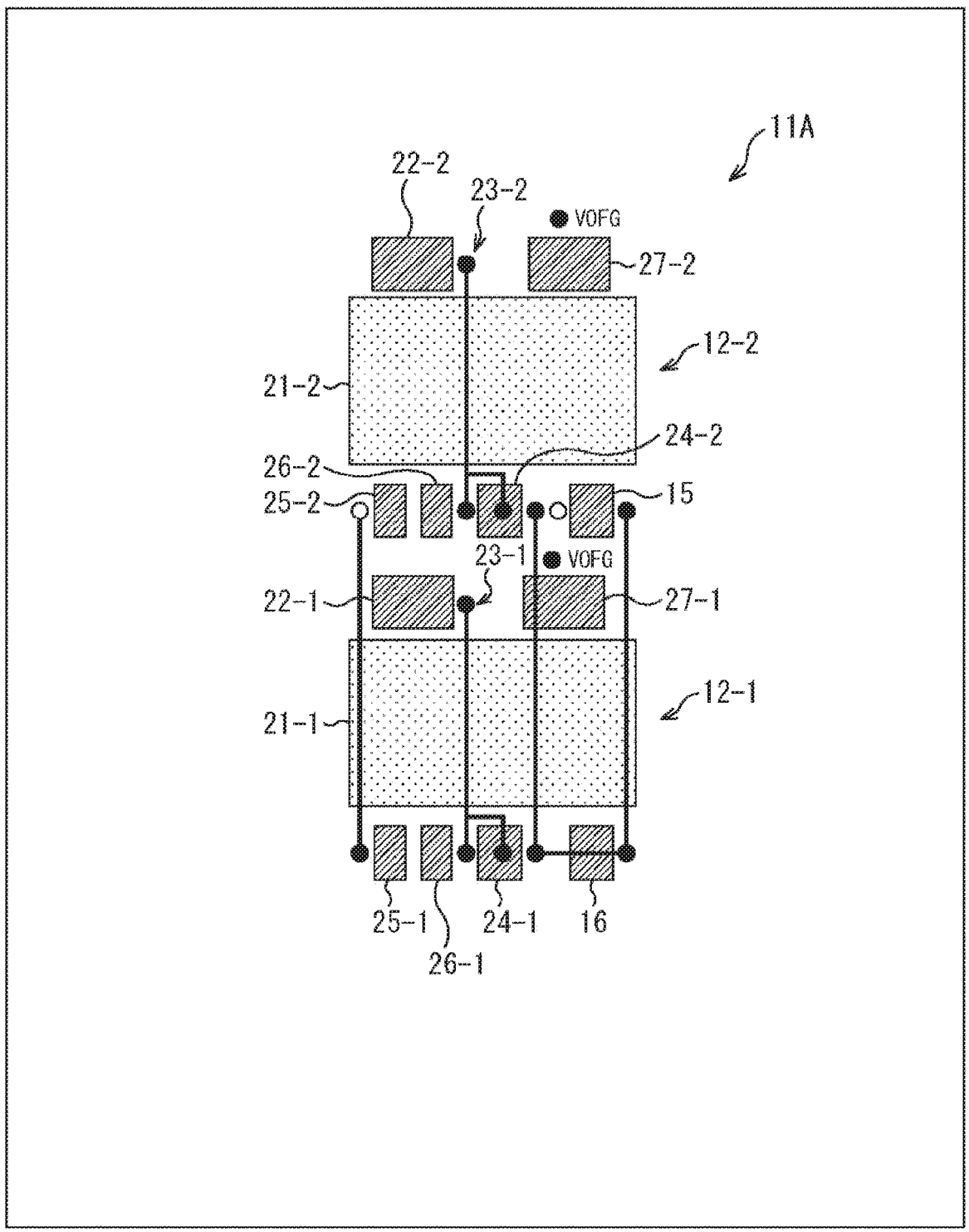
FIG. 5 is a diagram illustrating a planar layout of pixels in the configuration of FIG. 4.

FIG. 4 illustrates a circuit diagram of the imaging element 11A, and FIG. 5 illustrates a planar layout of the imaging element 11A.

As illustrated in FIGS. 4 and 5, in the imaging element 11A, two pixels 12-1 and 12-2 share an AD converter. In this point, the imaging element 11A has a configuration that is different from a configuration of the imaging element 11 of FIG. 1.

Similarly to the imaging element 11 of FIG. 1, the imaging element 11A having such a configuration can achieve global shutter in a structure in which a predetermined number of pixels 12 share an AD converter.

<Third Configuration Example of Imaging Element>

A third configuration example of an imaging element is described with reference to FIGS. 6 and 7. Note that, in an imaging element 11B illustrated in FIGS. 6 and 7, the same reference signs are used in a configuration that is common to the configuration of the imaging element 11 described above with reference to FIGS. 1 and 3, and the detailed description thereof is omitted.

Figure 6:
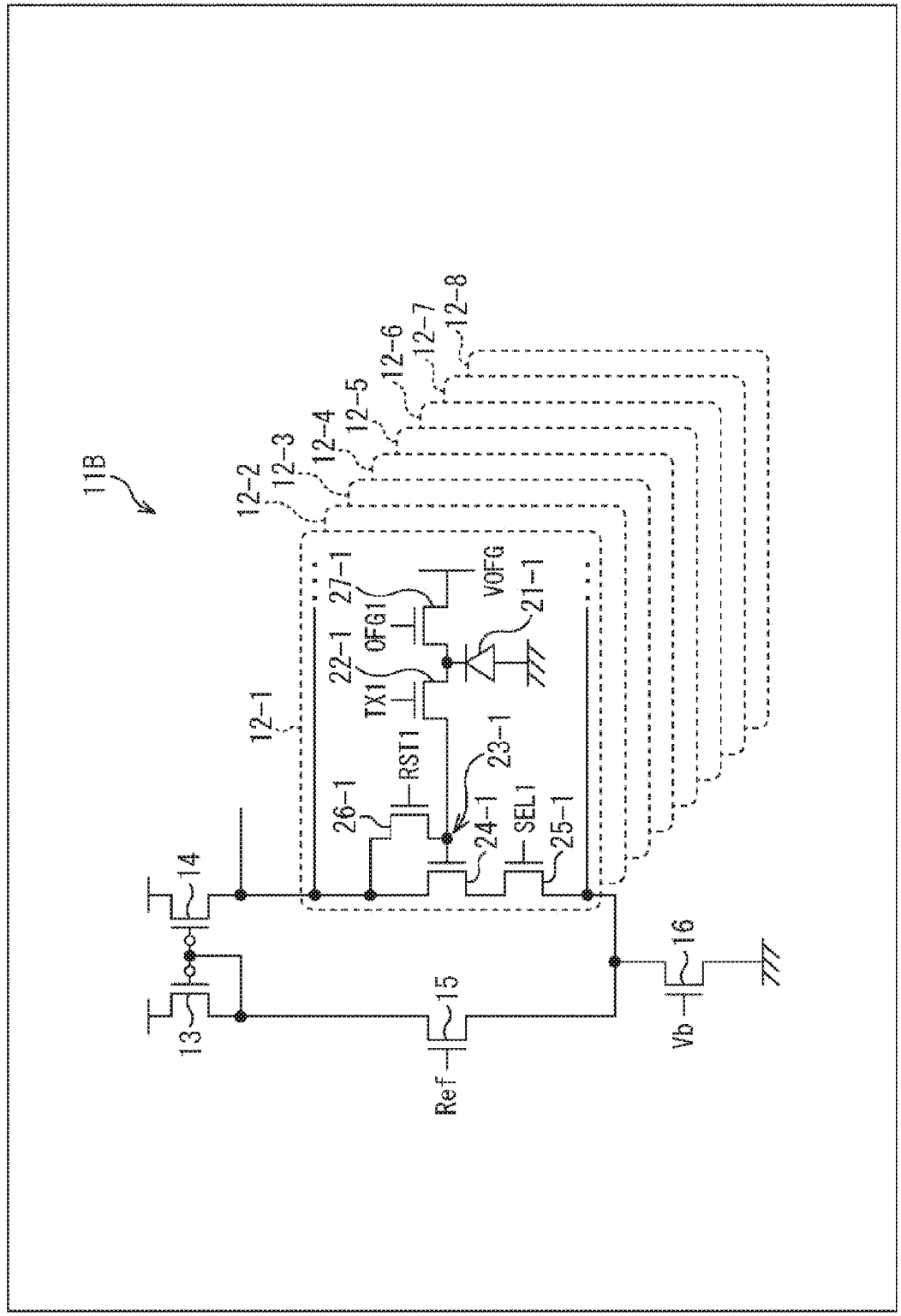
FIG. 6 is a circuit diagram illustrating a configuration example according to a third embodiment of the imaging element.
Figure 7:
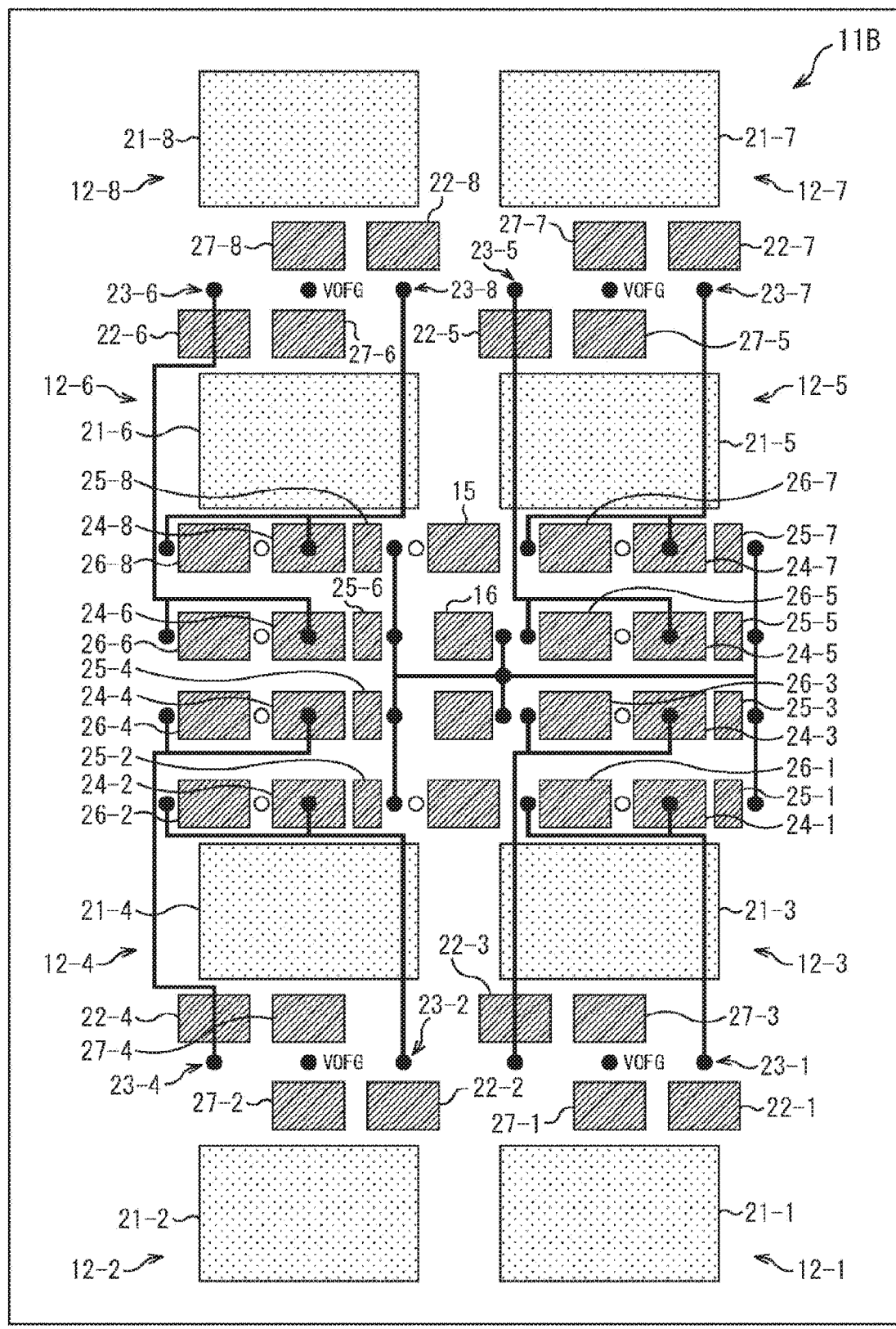
FIG. 7 is a diagram illustrating a planar layout of pixels in the configuration of FIG. 6.

FIG. 6 illustrates a circuit diagram of the imaging element 11B, and FIG. 7 illustrates a planar layout of the imaging element 11B.

As illustrated in FIGS. 6 and 7, in the imaging element 11B, eight pixels 12-1 to 12-8 share an AD converter. In this point, the imaging element 11B has a configuration that is different from the configuration of the imaging element 11 of FIG. 1.

Similarly to the imaging element 11 of FIG. 1, the imaging element 11B having such a configuration can achieve global shutter in a structure in which a predetermined number of pixels 12 share an AD converter.

<Fourth Configuration Example of Imaging Element>

A fourth configuration example of an imaging element is described with reference to FIGS. 8 and 9. Note that, in an imaging element 11C illustrated in FIGS. 8 and 9, the same reference signs are used in a configuration that is common to the configuration of the imaging element 11 described above with reference to FIGS. 1 and 3, and the detailed description thereof is omitted.

Figure 8:
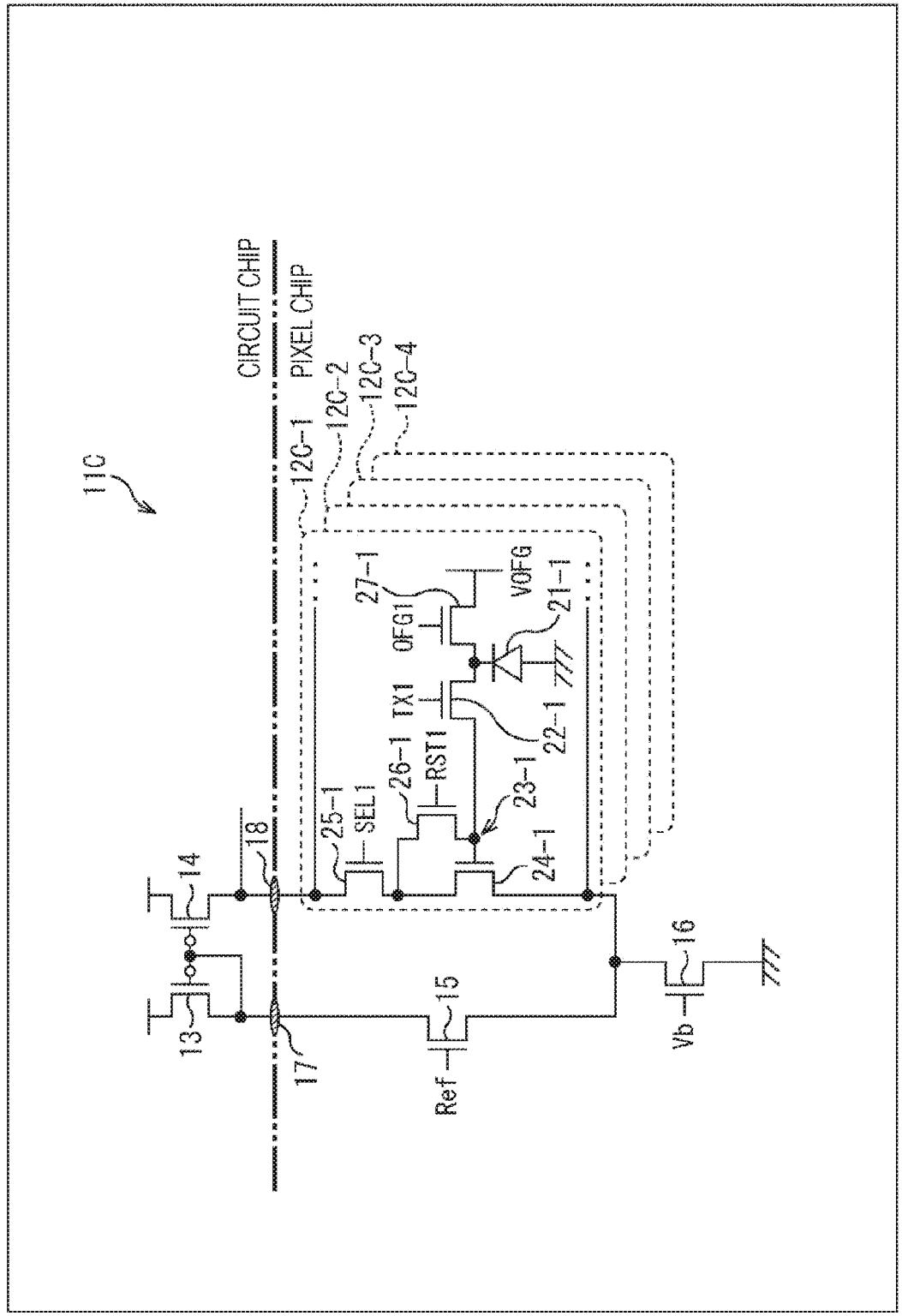
FIG. 8 is a circuit diagram illustrating a configuration example according to a fourth embodiment of the imaging element.
Figure 9:
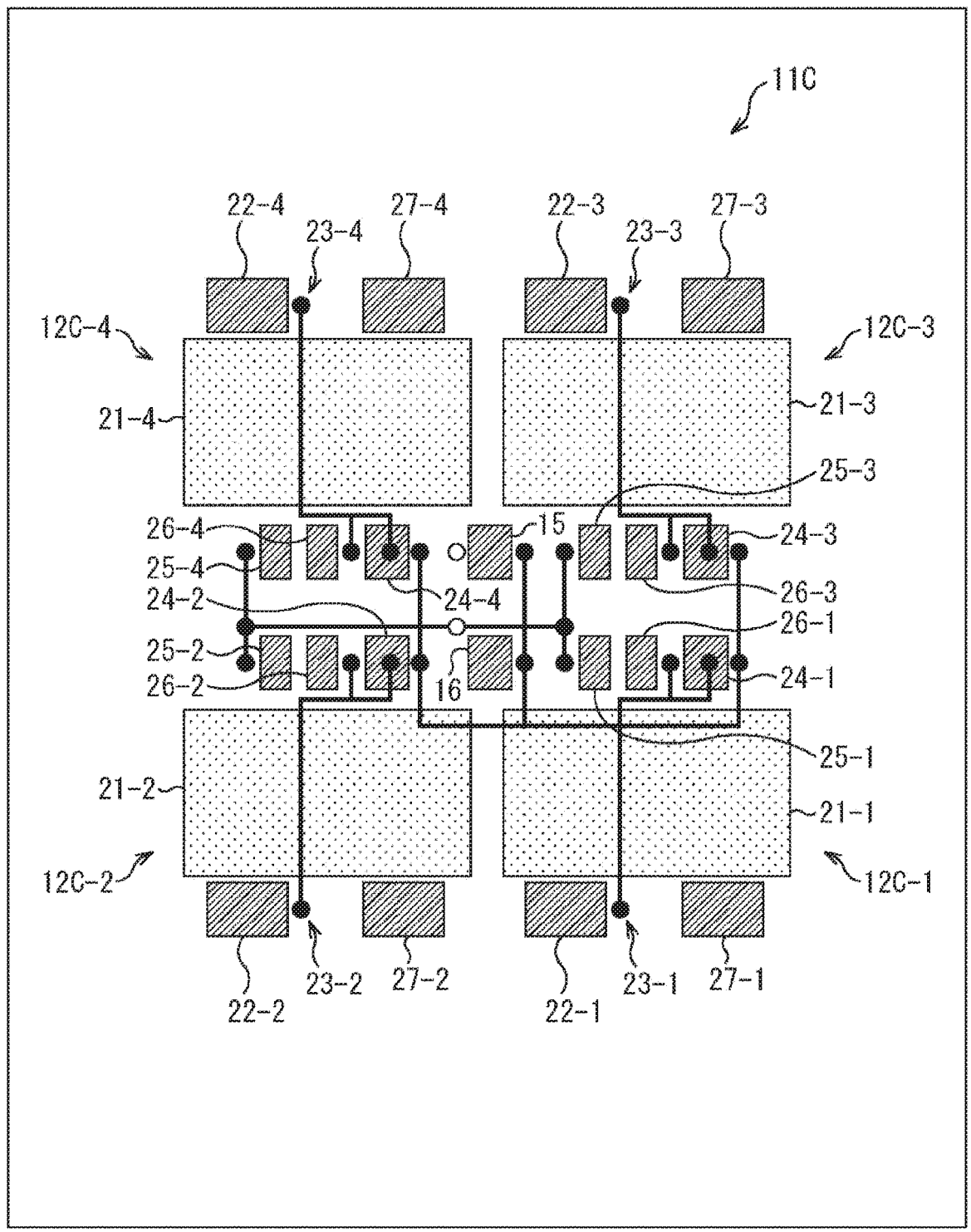
FIG. 9 is a diagram illustrating a planar layout of pixels in the configuration of FIG. 8.

FIG. 8 illustrates a circuit diagram of the imaging element 11C, and FIG. 9 illustrates a planar layout of the imaging element 11C. As illustrated, the imaging element 11C has a structure in which four pixels 12C-1 to 12C-8 share an AD converter.

As illustrated in FIG. 8, the imaging element 11C has a layered structure in which a circuit chip and a pixel chip have been stacked. Components that are formed in a circuit chip are illustrated above an alternating long and two short dashed line, and components that are formed in a pixel chip are illustrated below the alternating long and two short dashed line. For example, the MOS transistors 13 and 14 are formed on a side of the circuit chip, and pixels 12C, the MOS transistor 15, and the MOS transistor 16 are formed on a side of the pixel chip. Note that a signal processing circuit that performs signal processing on a pixel signal is formed in the circuit chip, and at least the photodiode 21 is formed in the pixel chip.

Furthermore, the circuit chip and the pixel chip are electrically connected via joining pads 17 and 18. For example, the joining pad 17 connects the MOS transistor 13 and the MOS transistor 15, and the joining pad 18 connects the MOS transistor 14 and the pixels 12C-1 to 12C-4. Furthermore, chips are connected in positions illustrated as a white dot in FIG. 9.

Moreover, the pixel 12C of the imaging element 11C has a configuration that is different from a configuration of the pixel 12 of the imaging element 11 of FIG. 1, and the selection transistor 25 is connected between the amplification transistor 24 and the MOS transistor 14. Stated another way, in the pixel 12 of FIG. 1, the selection transistor 25 is disposed on a side close to the MOS transistor 16 with respect to the amplification transistor 24. In contrast, in the pixel 12C, the selection transistor 25 is disposed on a side opposite to the side close to the MOS transistor 16. Furthermore, as illustrated in FIG. 8, the selection transistor 25 is formed on a side of the pixel chip, and a connection configuration is employed in which the selection transistor 25 and the MOS transistor 14 are connected via the joining pad 18.

In the imaging element 11C having such a configuration, and stated another way, in a structure in which an AD converter is shared by a predetermined number of pixels 12C having a configuration in which the selection transistor 25 is disposed on a side close to the MOS transistor 14, global shutter can be achieved similarly to the imaging element 11 of FIG. 1.

Note that the bias voltage Vb to be supplied to the MOS transistor 16 that generates a constant current needs to be generated in a current mirror circuit that uses a transistor having the same characteristics, and this bias voltage generation circuit is also configured on the pixel chip. For example, a current that the current mirror circuit uses as a reference is generated in the circuit chip, passes from a chip to a chip, and is supplied. At this time, it is desirable that a transistor of a not-illustrated bias voltage occurrence circuit have the same characteristics as characteristics of the transistors included in the pixel 12 in order to make currents match each other.

Furthermore, for example, a configuration is also conceivable in which the pixel 12 is directly disposed in the bias voltage occurrence circuit and only a transistor is used for a current mirror. For example, the size of the circuit chip is reduced by disposing, in the pixel chip, the bias voltage occurrence circuit requiring a significantly large area, and the bias circuit is disposed in a position of a RAM (for example, a static random access memory (SRAM)) of the circuit chip at the time of bonding. Thus, a final chip size after packaging can be reduced.

<Fifth Configuration Example of Imaging Element>

A fifth configuration example of an imaging element is described with reference to FIGS. 10 and 11. Note that, in an imaging element 11D illustrated in FIGS. 10 and 11, the same reference signs are used in a configuration that is common to the configuration of the imaging element 11 described above with reference to FIGS. 1 and 3 and the configuration of the imaging element 11C described above with reference to FIGS. 8 and 9, and the detailed description thereof is omitted.

Figure 10:
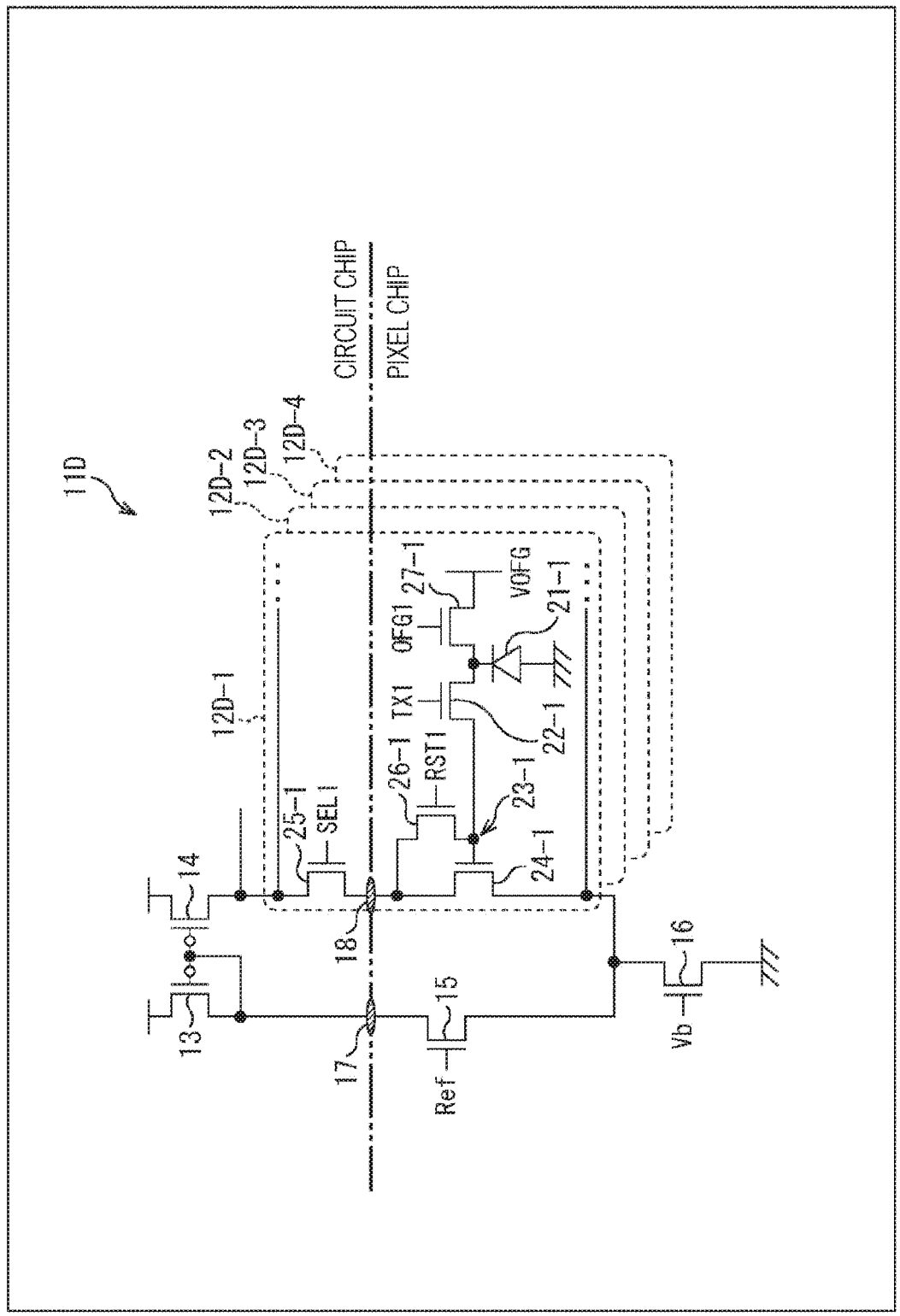
FIG. 10 is a circuit diagram illustrating a configuration example according to a fifth embodiment of the imaging element.
Figure 11:
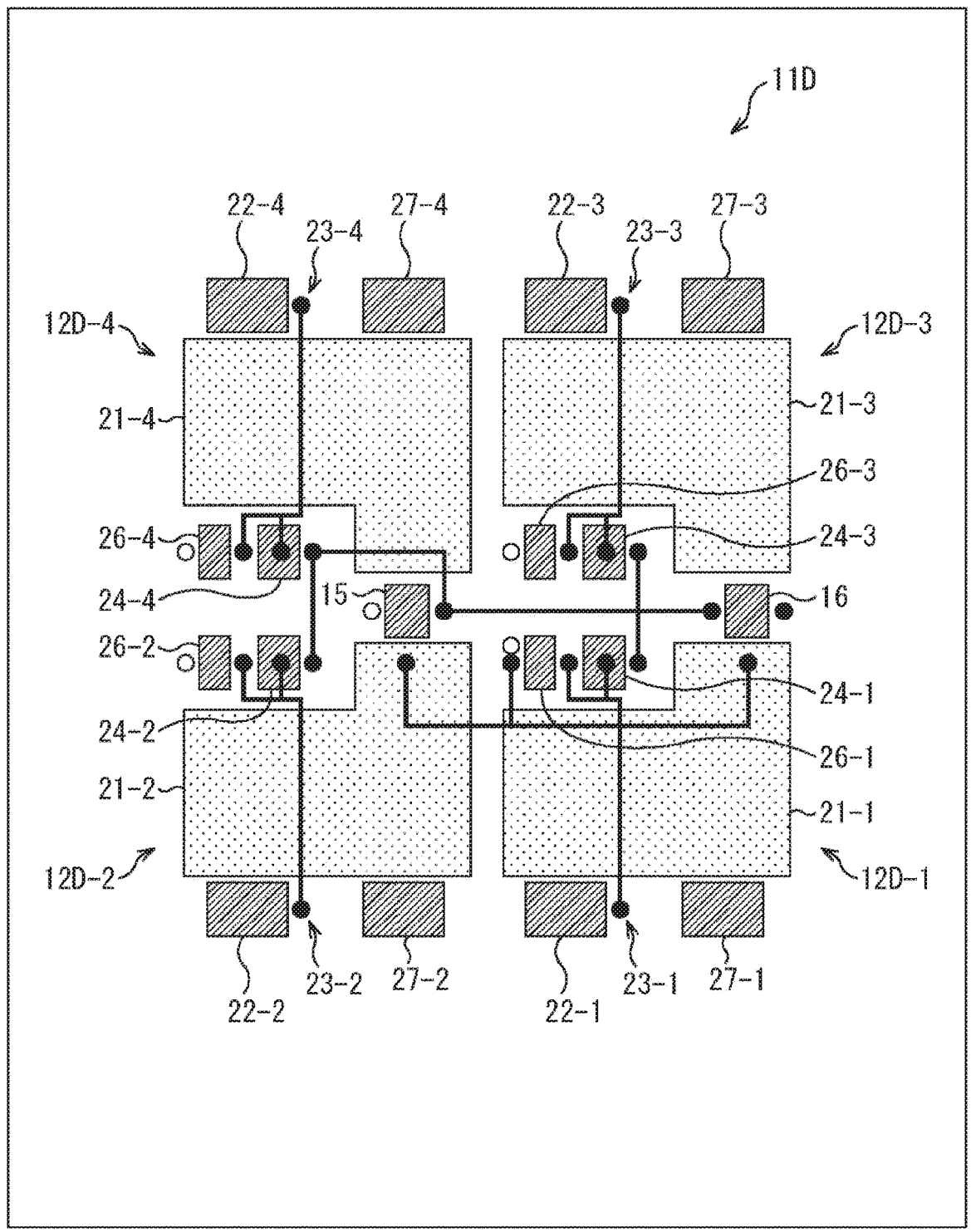
FIG. 11 is a diagram illustrating a planar layout of pixels in the configuration of FIG. 10.

FIG. 10 illustrates a circuit diagram of the imaging element 11D, and FIG. 11 illustrates a planar layout of the imaging element 11D. As illustrated, in the imaging element 11D, four pixels 12D-1 to 12D-8 share an AD converter, and a layered structure in which a circuit chip and a pixel chip have been stacked is employed.

Furthermore, in a pixel 12D of the imaging element 11D, the selection transistor 25 is connected between the amplification transistor 24 and the MOS transistor 14. In this point, the pixel 12D of the imaging element 11D has a configuration that is similar to a configuration of the pixel 12C of FIG. 8. On the other hand, in the pixel 12C of FIG. 8, the amplification transistor 24 is formed on a side of the pixel chip. In contrast, as illustrated in FIG. 10, in the pixel 12D, the amplification transistor 24 is formed on a side of the circuit chip.

Stated another way, in the imaging element 11D, the pixel 12D is formed over the circuit chip and the pixel chip. Stated another way, the selection transistor 25 is formed on the side of the circuit chip, and the photodiode 21, the transfer transistor 22, the FD unit 23, the amplification transistor 24, and the reset transistor 26 are formed on the side of the pixel chip. Then, a connection configuration is employed in which the selection transistor 25 and the reset transistor 26 are connected via the joining pad 18.

In the imaging element 11D having such a configuration, and stated another way, in a structure in which an AD converter is shared by a predetermined number of pixels 12C having a configuration in which the selection transistor 25 is disposed on the side of the circuit chip, global shutter can be achieved similarly to the imaging element 11 of FIG. 1. Moreover, in the pixel 12D, the area of the photodiode 21 can be increased by the area of the selection transistor 25 that is not provided on the side of the pixel chip, as illustrated in FIG. 11, in comparison with the pixel 12 of FIG. 1, and a larger amount of charge can be accumulated. Therefore, the imaging element 11 can improve, for example, sensitivity, and noise can be suppressed in imaging in a dark place.

<Sixth Configuration Example of Imaging Element>

A sixth configuration example of an imaging element is described with reference to FIGS. 12 and 13. Note that, in an imaging element 11E illustrated in FIGS. 12 and 13, the same reference signs are used in a configuration that is common to the configuration of the imaging element 11 described above with reference to FIGS. 1 and 3, and the detailed description thereof is omitted.

Figure 12:
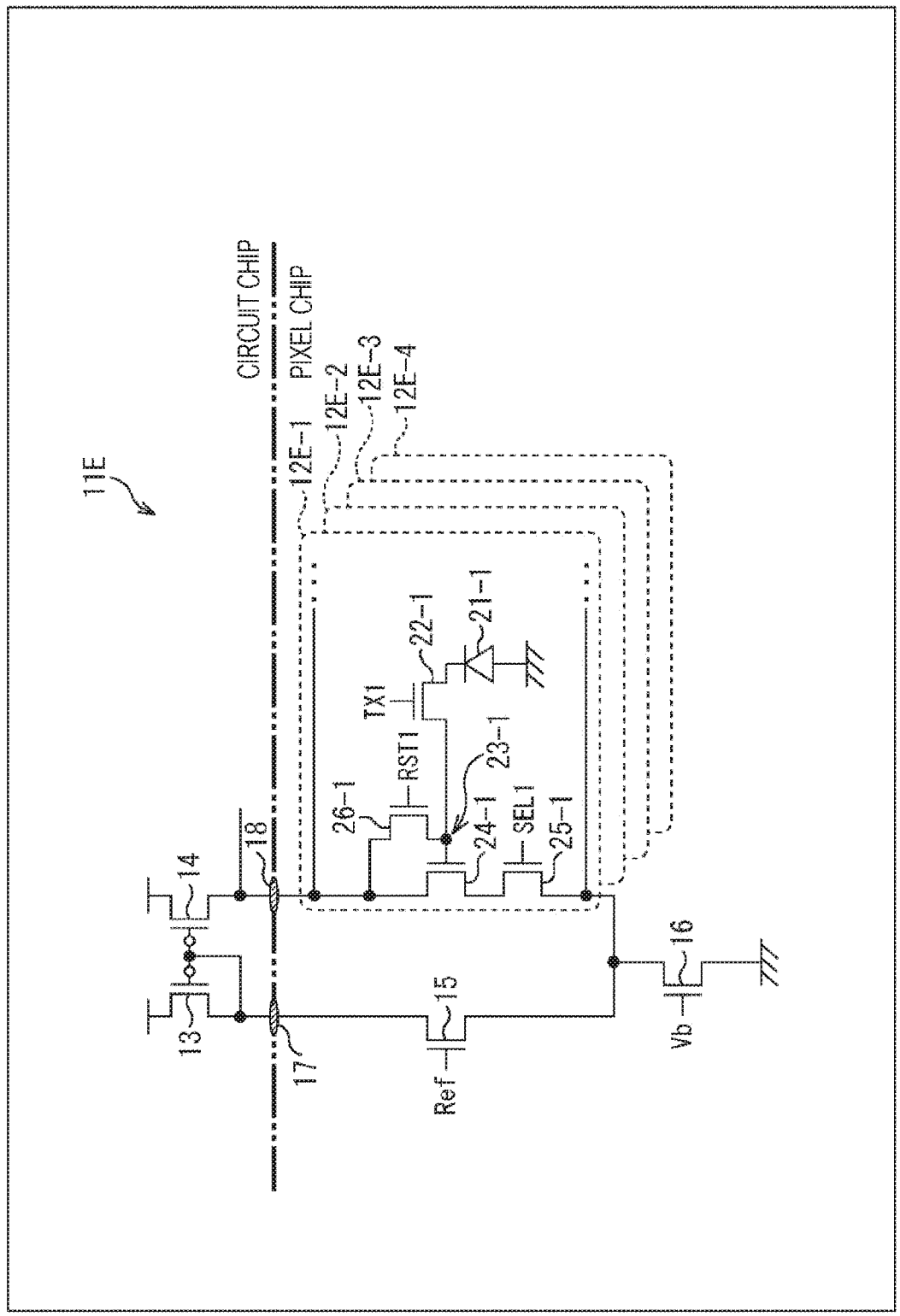
FIG. 12 is a circuit diagram illustrating a configuration example according to a sixth embodiment of the imaging element.
Figure 13:
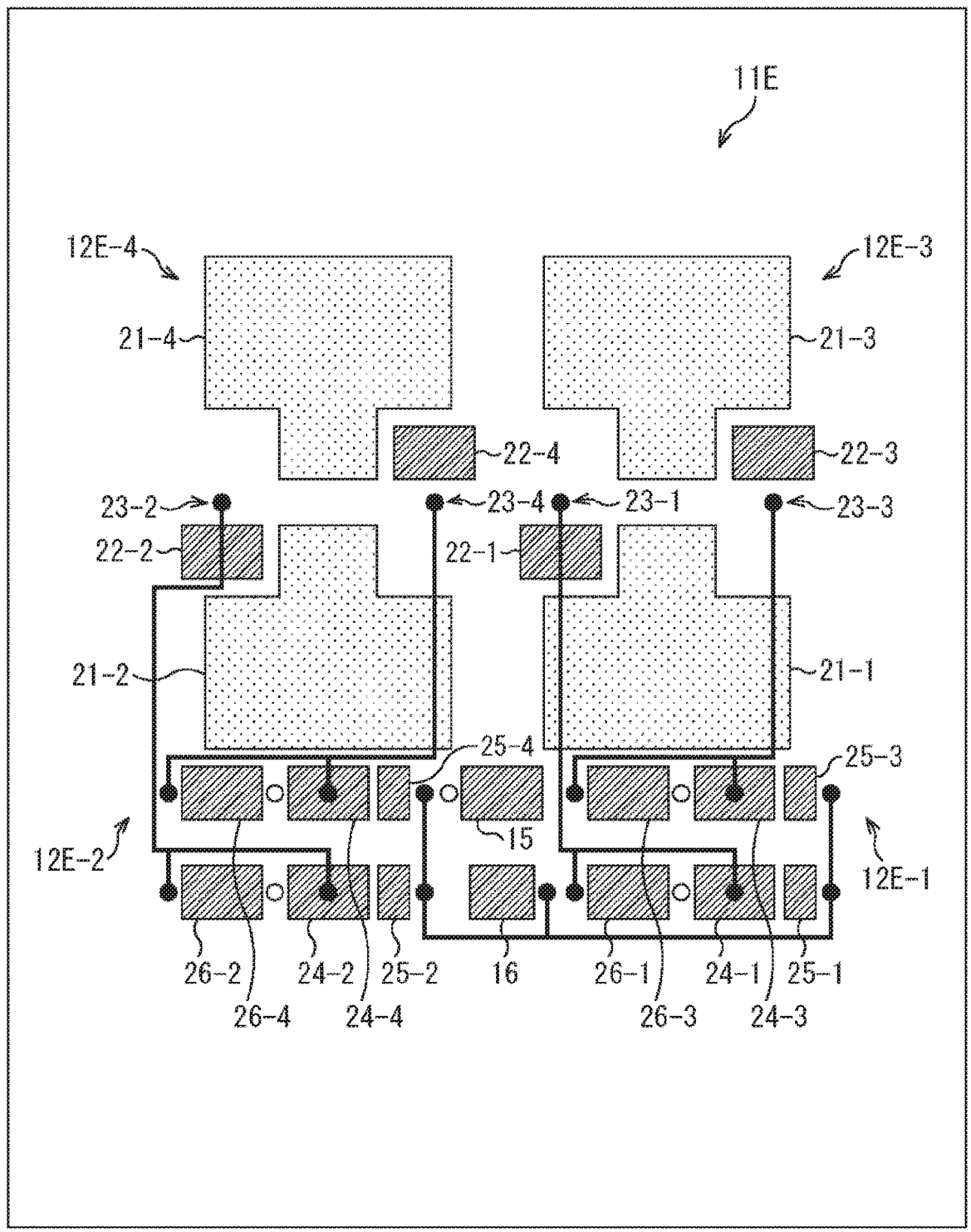
FIG. 13 is a diagram illustrating a planar layout of pixels in the configuration of FIG. 12.

FIG. 12 illustrates a circuit diagram of the imaging element 11E, and FIG. 13 illustrates a planar layout of the imaging element 11E. As illustrated, in the imaging element 11E, four pixels 12E-1 to 12E-8 share an AD converter, and a layered structure in which a circuit chip and a pixel chip have been stacked is employed.

Then, a pixel 12E of the imaging element 11E does not include the overflow transistor 27. In this point, the pixel 12E of the imaging element 11E has a configuration that is different from the pixel 12 of the imaging element 11 of FIG. 1. Stated another way, the pixel 12E includes the photodiode 21, the transfer transistor 22, the FD unit 23, the amplification transistor 24, the selection transistor 25, and the reset transistor 26.

In the pixel 12E having such a configuration, for example, it takes more time to initialize the photodiode 21 (discharge charge accumulated in the photodiode 21 before exposure) than in the pixel 12 of FIG. 1. On the other hand, in the pixel 12E, the area of the photodiode 21 can be increased by the area of the overflow transistor 27 that is not provided, as illustrated in FIG. 13, in comparison with the pixel 12 of FIG. 1, and a larger amount of charge can be accumulated. Therefore, the imaging element 11 can improve, for example, sensitivity, and noise can be suppressed in imaging in a dark place.

Note that the imaging element 11 described above has a configuration in which an AD converter is shared by every predetermined number of pixels 12 (for example, every two pixels, every four pixels, or every eight pixels). However, for example, a configuration may be employed in which the AD converter is provided for every one pixel 12.

<Configuration Example of Electronic Device>

An imaging element 11, as described above, can be applied to various electronic devices, e.g., imaging systems such as digital still cameras or digital video cameras, mobile phones having an imaging function, or other devices having the imaging function.

Figure 14:
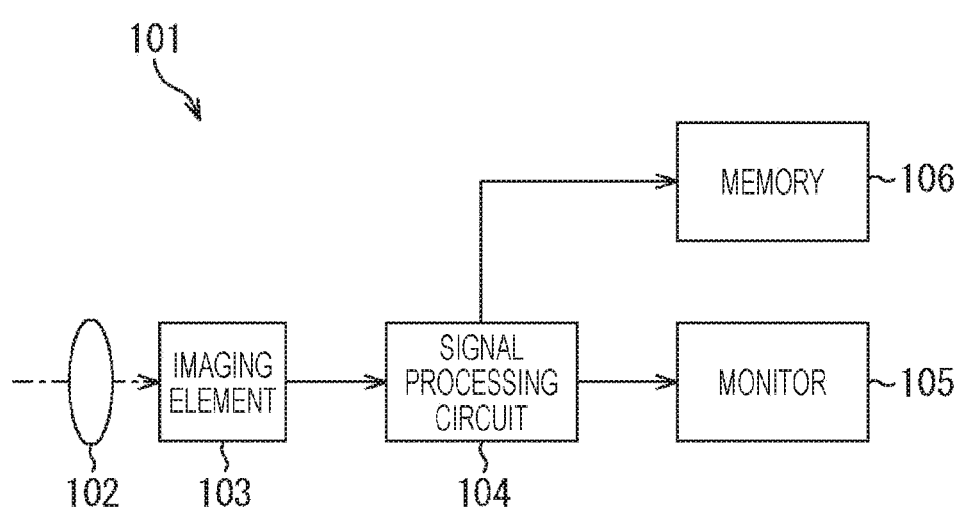
FIG. 14 is a block diagram illustrating a configuration example of an imaging apparatus.

FIG. 14 is a block diagram illustrating a configuration example of an imaging apparatus that is mounted on an electronic device.

As illustrated in FIG. 14, an imaging apparatus 101 includes an optical system 102, an imaging element 103, a signal processing circuit 104, a monitor 105, and a memory 106, and can capture a still image and a moving image.

The optical system 102 includes one or a plurality of lenses, guides, to the imaging element 103, image light (incident light) from a subject, and causes an image to be formed on a light receiving surface (a sensor) of the imaging element 103.

As the imaging element 103, the imaging element 11 described above is applied. In the imaging element 103, electrons are accumulated according to the image that has been formed on the light receiving surface via the optical system 102 during a prescribed period. Then, a signal according to the electrons accumulated in the imaging element 103 is supplied to the signal processing circuit 104.

The signal processing circuit 104 performs various types of signal processing on a pixel signal that has been output from the imaging element 103. An image (image data) that has been obtained by the signal processing circuit 104 performing signal processing is supplied to the monitor 105 and is displayed on the monitor 105, or is supplied to the memory 106 and is stored (recorded) in the memory 106.

By applying the imaging element 11 described above to the imaging apparatus 101 configured as described above, for example, a high-quality image obtained by exposing all of the pixels at the same timing can be captured.

<Usage Example of Image Sensor>

FIG. 15 illustrates a usage example in which the image sensor (the imaging element) described above is used.

The image sensor described above can be used, for example, in various cases where light, such as visible light, infrared light, ultraviolet light, or X-rays, is sensed, as described below.

Devices provided for appreciation that capture images, such as digital cameras or portable devices having a camera function Devices provided for traffic, such as on-vehicle sensors that image a front side, a rear side, the periphery, an inside, or the like of an automobile for the purpose of safe driving such as automatic stop, the recognition of the state of a driver, or the like, monitoring cameras that monitor travelling vehicles or roads, or ranging sensors that measure a distance between vehicles or the like Devices provided in consumer electronics, such as TVs, refrigerators, or air conditioners, in order to image a user's gesture and operate a device in accordance with the gesture Devices provided for medical treatment or health care, such as endoscopes or devices that perform angiography by receiving infrared light Devices provided for security, such as monitoring cameras for crime prevention or cameras for personal authentication Devices provided for beauty, such as skin measuring devices that image skin or microscopes that image a scalp Devices provided for sports, such as action cameras or wearable cameras for sport usage or the like Devices provided for agriculture, such as cameras that monitor the state of fields or crops <Example of Combination of Configurations>

Note that the present technology can also employ the configurations described below.

(1)

A solid-state imaging element including:

a pixel that at least includes a photoelectric conversion unit configured to perform photoelectric conversion, an FD unit to which charge generated in the photoelectric conversion unit is transferred, and an amplification transistor that has a gate electrode to which the FD unit is connected; and a first MOS transistor to which a reference signal is input, the reference signal being referred to when AD conversion is performed on a pixel signal according to an amount of light received by the pixel, in which a shared structure is employed in which a predetermined number of the pixels share an AD converter that includes a differential pair including the first MOS transistor and the amplification transistor, and a selection transistor is provided for each of the pixels, the selection transistor being used to select the pixel for which the AD conversion is performed on the pixel signal.

(2)

The solid-state imaging element described in (1) described above, further including:

a second MOS transistor to which a constant bias voltage is input, in which the selection transistor is disposed on a side close to the second MOS transistor with respect to the amplification transistor.

(3)

The solid-state imaging element described in (1) described above, further including:

a second MOS transistor to which a constant bias voltage is input, in which the selection transistor is disposed on a side opposite to the second MOS transistor with respect to the amplification transistor.

(4)

The solid-state imaging element described in (3) described above, in which the solid-state imaging element has a layered structure obtained by stacking a pixel chip in which at least the photoelectric conversion unit is formed, and a circuit chip in which a signal processing circuit that performs signal processing on the pixel signal is formed, and the selection transistor is formed on a side of the circuit chip.

(5)

The solid-state imaging element described in any of (1) to (4) described above, in which the pixel further includes a discharge transistor that discharges the charge accumulated in the photoelectric conversion unit before exposure is started.

(6)

An electronic device including a solid-state imaging element, in which the solid-state imaging element includes a pixel that at least includes a photoelectric conversion unit configured to perform photoelectric conversion, an FD unit to which charge generated in the photoelectric conversion unit is transferred, and an amplification transistor that has a gate electrode to which the FD unit is connected, and a first MOS transistor to which a reference signal is input, the reference signal being referred to when AD conversion is performed on a pixel signal according to an amount of light received by the pixel, a shared structure is employed in which a predetermined number of the pixels share an AD converter that includes a differential pair including the first MOS transistor and the amplification transistor, and a selection transistor is provided for each of the pixels, the selection transistor being used to select the pixel for which the AD conversion is performed on the pixel signal.

Note that the present embodiments are not limited to the embodiments described above, and various changes can be made without departing from the gist of the present disclosure. Furthermore, the effects described herein are only illustrative and are not restrictive, and other effects may be exhibited.

REFERENCE SIGNS LIST

11 Imaging element
12 Pixel
13 to 16 MOS transistor
17 and 18 Joining pad
21 Photodiode
22 Transfer transistor
23 FD unit
24 Amplification transistor
25 Selection transistor
26 Reset transistor
27 Overflow transistor

The invention claimed is:

1. A solid-state imaging element, comprising:
   a plurality of pixels, wherein each pixel of the plurality of pixels includes:
      a photodiode configured to perform photoelectric conversion;

a floating diffusion (FD) unit to which charge generated in the photodiode is transferred;

a transfer transistor configured to transfer the charge generated in the photodiode to the FD unit, wherein the transfer transistor of a first pixel of the plurality of pixels is configured to transfer the charge to the FD unit of the first pixel concurrently with the transfer of the charge by the transfer transistor of a second pixel of the plurality of pixels to the FD unit of the second pixel;

an amplification transistor that includes a gate electrode connected to the FD unit; and a selection transistor configured to select a pixel of the plurality of pixels; and an analog to digital (AD) converter that includes:

a differential pair including a first metal oxide semiconductor (MOS) transistor to which a reference signal is input and the amplification transistor;

a second MOS transistor;

a third MOS transistor; and a fourth MOS transistor, wherein a gate electrode of the third MOS transistor and a gate electrode of the fourth MOS transistor are connected to each of a drain of the third MOS transistor and a drain of the first MOS transistor, a source of the first MOS transistor is connected to a drain of the second MOS transistor, the plurality of pixels is connected in parallel between the drain of the second MOS transistor and a drain of the fourth MOS transistor, the AD converter is configured to execute an AD conversion on a pixel signal based on an amount of light received by the selected pixel, the AD conversion is executed with respect to the reference signal, and a specific number of pixels of the plurality of pixels share the AD converter.

2. The solid-state imaging element according to claim 1, further wherein the second MOS transistor is input with a constant bias voltage, and the selection transistor is on a side close to the second MOS transistor with respect to the amplification transistor.

3. The solid-state imaging element according to claim 1, wherein the second MOS transistor is input with a constant bias voltage, and the selection transistor is on a side opposite to the second MOS transistor with respect to the amplification transistor.

4. The solid-state imaging element according to claim 1, wherein the solid-state imaging element has a layered structure, the layered structure includes a pixel chip and a circuit chip, the photodiode is on the pixel chip, the circuit chip includes a signal processing circuit, the signal processing circuit is configured to execute a signal process on the pixel signal, and the selection transistor is on a side of the circuit chip.

5. The solid-state imaging element according to claim 1, wherein each pixel of the plurality of pixels further includes a discharge transistor configured to discharge the charge accumulated in the photodiode.

6. An electronic device, comprising:

a solid-state imaging element that includes:

a plurality of pixels, wherein each pixel of the plurality of pixels includes:

a photodiode configured to perform photoelectric conversion;

a floating diffusion (FD) unit to which charge generated in the photodiode is transferred;

a transfer transistor configured to transfer the charge generated in the photodiode to the FD unit, wherein the transfer transistor of a first pixel of the plurality of pixels is configured to transfer the charge to the FD unit of the first pixel concurrently with the transfer of the charge by the transfer transistor of a second pixel of the plurality of pixels to the FD unit of the second pixel;

an amplification transistor that includes a gate electrode connected to the FD unit; and a selection transistor configured to select a pixel of the plurality of pixels; and an analog to digital (AD) converter that includes:

a differential pair including a first metal oxide semiconductor (MOS) transistor to which a reference signal is input and the amplification transistor;

a second MOS transistor;

a third MOS transistor; and a fourth MOS transistor, wherein a gate electrode of the third MOS transistor and a gate electrode of the fourth MOS transistor are connected to each of a drain of the third MOS transistor and a drain of the first MOS transistor, a source of the first MOS transistor is connected to a drain of the second MOS transistor, the plurality of pixels is connected in parallel between the drain of the second MOS transistor and a drain of the fourth MOS transistor, the AD converter is configured to execute an AD conversion on a pixel signal based on an amount of light received by the selected pixel, the AD conversion is executed with respect to the reference signal, and a specific number of pixels of the plurality of pixels share the AD converter.

\* \* \* \* \*